United States Patent
Kane et al.

(10) Patent No.: US 7,423,905 B2
(45) Date of Patent: Sep. 9, 2008

(54) READ-ONLY MEMORY USING LINEAR PASSIVE ELEMENTS

(75) Inventors: Michael G. Kane, Skillman, NJ (US); Arthur Herbert Firester, Skillman, NJ (US); Gong Gu, Bridgewater, NJ (US)

(73) Assignee: Sarnoff Corporation, Princeton, NJ (US)

( * ) Notice: Subject to any disclaimer, the term of this patent is extended or adjusted under 35 U.S.C. 154(b) by 44 days.

(21) Appl. No.: 11/678,109

(22) Filed: Feb. 23, 2007

(65) Prior Publication Data

US 2007/0211511 A1    Sep. 13, 2007

Related U.S. Application Data

(60) Provisional application No. 60/780,156, filed on Mar. 8, 2006, provisional application No. 60/849,110, filed on Oct. 3, 2006.

(51) Int. Cl.
*G11C 11/34* (2006.01)

(52) U.S. Cl. .................... 365/185.11; 365/148; 365/94

(58) Field of Classification Search ............ 365/185.11, 365/100, 94, 103, 148, 149, 185.23, 185.27, 365/230.06, 225.5
See application file for complete search history.

(56) References Cited

U.S. PATENT DOCUMENTS

| | | | |
|---|---|---|---|
| 4,839,859 A | 6/1989 | Moonpenn et al. | |
| 5,536,968 A * | 7/1996 | Crafts et al. | 257/529 |
| 6,570,795 B1 | 5/2003 | Fricke et al. | |
| 6,587,370 B2 * | 7/2003 | Hirai | 365/171 |
| 7,180,495 B1 * | 2/2007 | Matsueda | 345/98 |
| 2004/0085463 A1 | 5/2004 | Sharma et al. | |
| 2005/0141263 A1 | 6/2005 | Umeda et al. | |
| 2006/0139993 A1 * | 6/2006 | Kang et al. | 365/158 |
| 2008/0025132 A1 * | 1/2008 | Fasoli et al. | 365/230.06 |
| 2008/0025134 A1 * | 1/2008 | Scheuerlein et al. | 365/230.06 |

\* cited by examiner

*Primary Examiner*—Dang T Nguyen
(74) *Attorney, Agent, or Firm*—Lowenstein Sandler PC

(57) ABSTRACT

A read-only memory (ROM) is disclosed that uses the presence or absence of linear passive electrical elements, such as resistors or capacitors, to encode zeros and ones, permitting a large-area ROM to be fabricated, possibly on a flexible substrate. The ROM includes a substrate, a plurality of row conductors insulated from each other and at least partially layered on a portion of the substrate; a plurality of column conductors insulated from each other and from the row conductors and at least partially layered above or below a portion of the plurality of row conductors, a plurality of amplifiers electrically connected to the column conductors, and at least one linear passive element attached between the row conductors and the column conductors. An amplifier connected to a column conductor has an input impedance much lower than the combined parallel impedance of the linear passive elements connected to that column, thus comprising a virtual ground, and is operable to output a first logical state when one of the linear passive elements is electrically connected between one of the row conductors and one of the column conductors, and operable to output a second local state when said one of the linear passive elements is absent between one of the row conductors and one of the column conductors. The resistive or capacitive arrays can be made into low-cost imagers if the resistors/capacitors are sensitive to electromagnetic radiation or mechanical pressure.

30 Claims, 5 Drawing Sheets

READ-ONLY MEMORY USING LINEAR PASSIVE ELEMENTS

CROSS-REFERENCE TO RELATED APPLICATIONS

This application claims the benefit of U.S. provisional patent application No. 60/780,156 filed Mar. 8, 2006, and U.S. provisional patent application No. 60/849,110 filed Oct. 3, 2006, the disclosures of which are incorporated herein by reference in their entirety.

FIELD OF THE INVENTION

The present invention relates generally to read-only memories (ROMs) and imagers, and more particularly, to read-only memories and imagers composed of arrays of linear passive elements.

BACKGROUND OF THE INVENTION

Read-only memories (ROMs) have existed for as long as there has been a need for memory for computing devices. Traditionally, ROMs have been manufactured on silicon integrated circuits of millimeter dimensions for use in microprocessor-based commercial and military applications. However, applications exist for ROMs that are manufactured on large-area flexible substrates made from plastic, paper, or cardboard. Here "large-area" means larger than typical millimeter-scale silicon integrated circuit dimensions. It is also desirable for the stored digital information in a large-area ROM to be easily programmable at the end of the fabrication process, perhaps using a high-speed printer. For example, one application of this type of ROM is for storing the serial number of a product in an electronic, machine-readable form on the product packaging.

Fabricating a ROM on a large-area, flexible substrate is technologically challenging, since standard ROM architectures used in integrated circuits place transistors in each ROM cell. While fabrication of transistors on large-area substrates is possible, with current technology it is only possible on rigid substrates such as large sheets of glass, and it requires very capital-intensive, technologically advanced process lines. This is the technology used for active-matrix displays, with fabrication facilities costing about $4 billion. Fabricating transistors on flexible substrates, even small ones, is very difficult, and is only done in research labs; no production process exists at this time.

An alternative approach for manufacturing ROMs that does not require transistors is known in the art. Instead of transistors, this approach uses nonlinear two-terminal elements such as a diodes. For example, Schottky diodes have been fabricated in laboratory environments using a metal layer and a conducting polymer layer, which is compatible with a flexible substrate. This approach is shown in FIG. 1. The ROM 2 includes a plurality of row conductors 4a-4n which are laid out in a separate plane, possible perpendicular to, but not contacting a plurality of column conductors 6a-6n. A ROM cell 8 includes a segment of one of the row conductors 4b, a segment of one of the column conductors 6b, and a diode 10. The anode 12 of the diode 10 is connected to a contact 14 on the row conductor 4b and the cathode 16 is connected to a contact 18 on the column conductor 6b. A zero or one is permanently encoded into the ROM cell 8 during fabrication by the presence or absence of the diode 10 between the row conductor 4b and the column conductor 6b. The information in a particular row, e.g. 4a, is read out by voltage sensing amplifiers 20a, 20n, by applying a positive voltage pulse 22 on the row conductor 4a, and sensing the voltage emanating from all the buffer amplifiers 20a-20n on all columns. The pull-down resistor 11 on each of the columns 6a-6n maintains that column at a fixed voltage of zero volts unless it is pulled up to a positive voltage by a diode in the selected row. The reason a diode or other nonlinear element is used in the prior art is to prevent current from flowing from a column into unselected rows, which would keep the column from being pulled up to a full positive voltage, but would hold it near zero volts.

Because diodes can be fabricated more easily than transistors, fabrication of a diode-based ROM on a large-area, flexible substrate is somewhat easier than fabrication of a transistor-based ROM on a large-area, flexible substrate. Nevertheless, fabrication of diodes on flexible substrates, even over a small area, is very difficult, and at this time is only performed at the research level.

As such, there is a need in the art for a ROM whose elements can be manufactured cost-effectively on a large-area, flexible substrate.

SUMMARY OF THE INVENTION

The above-described problems are addressed and a technical solution is achieved in the art by providing a read-only memory (ROM) that uses the presence or absence of linear passive electrical elements, such as resistors or capacitors, to encode zeros and ones, permitting a large-area ROM to be fabricated on a flexible substrate. The ROM includes a substrate, a plurality of row conductors insulated from each other and covering a portion of the substrate; a plurality of column conductors insulated from each other and covering the row conductors and at least partially layered on a portion of the plurality of row conductors, a plurality of amplifiers electrically connected to the column conductors, and at least one linear passive element connected between the row conductors and the column conductors. An amplifier connected to a column conductor is operable to output a first logical state when one of the linear passive elements is electrically connected between one of the row conductors and one of the column conductors, and operable to output a second logical state when said one of the linear passive elements is absent between one of the row conductors and one of the column conductors.

Each amplifier is connected in a negative feedback configuration with either a resistor or a capacitor connected between an amplifier output and an amplifier input. The amplifier input acts as a virtual ground input. The linear passive elements can be formed at every row-column intersection, with the information stored in the ROM by means of conducting straps that connect the linear passive elements to the rows and/or columns. The conducting straps can be formed using a printer in order to program digital information into the ROM at the end of the fabrication process. The linear passive elements can be created using resistive or conductive inks which are printed by means of either screen printing or ink-jet printing. The resistive or capacitive arrays can be made into low-cost imagers if the resistors/capacitors are sensitive to electromagnetic radiation or mechanical pressure.

BRIEF DESCRIPTION OF THE DRAWINGS

The present invention will be more readily understood from the detailed description of exemplary embodiments presented below considered in conjunction with the attached drawings, of which.

It is to be understood that the attached drawings are for purposes of illustrating the concepts of the invention and may not be to scale.

DETAILED DESCRIPTION OF THE INVENTION

Figure 2:
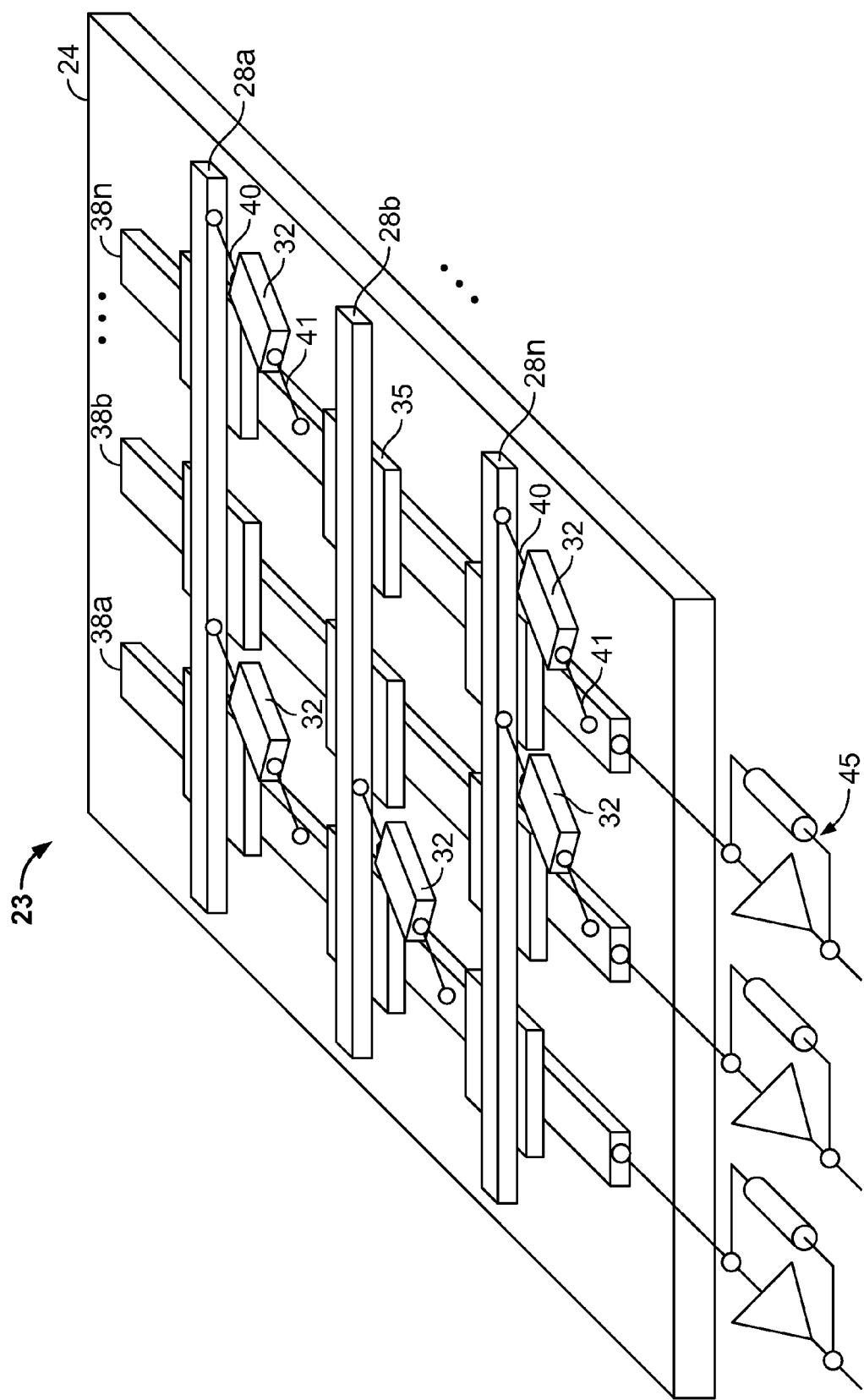
FIG. 2 is front perspective view of the layers of a ROM, constructed from an array of linear passive elements in accordance with an embodiment of the present invention.

FIG. 2 shows a ROM 23 constructed in accordance with an embodiment of the present invention. A plurality of layers is formed on a substrate 24, which may be flexible or rigid. The substrate is preferably made of a plastic material, such as polyethylene terephthalate (PET) or polyimide. A plurality of row conductors 28a-28n, insulated from each other, is formed overlying the flexible substrate 24. One or more linear passive elements 32, such as resistors or capacitors, are formed so that electrical connection is made between one end of each linear passive element 32 and one of the row conductors 28a-28n. A plurality of column conductors 38a-38n, insulated from each other, and insulated from the row conductors 28a-28n by insulators 35 at the crossover points between rows and columns, is formed so that electrical connection is made between the other end of each linear passive element 32 and one of the column conductors 38a-38n. FIG. 2 shows the column conductors lying above the row conductors, but the column conductors can equally well lie below the row conductors, as long as they are insulated from the row conductors at the crossover points. Active components, such as amplifiers 45, are formed external to the layered materials formed on substrate 24. For ease of programming, the ROM 23 can be fabricated with a linear passive element at every row-column intersection, with the information stored in the ROM 23 by means of conducting straps 40, 41 that connect the linear passive elements 32 to the row conductors 28a-28n and/or the column conductors 38a-38n. In some embodiments, the linear passive elements and/or the conducting straps can be created using resistive or conductive inks which may be screen printed or ink-jet printed.

Figure 3:
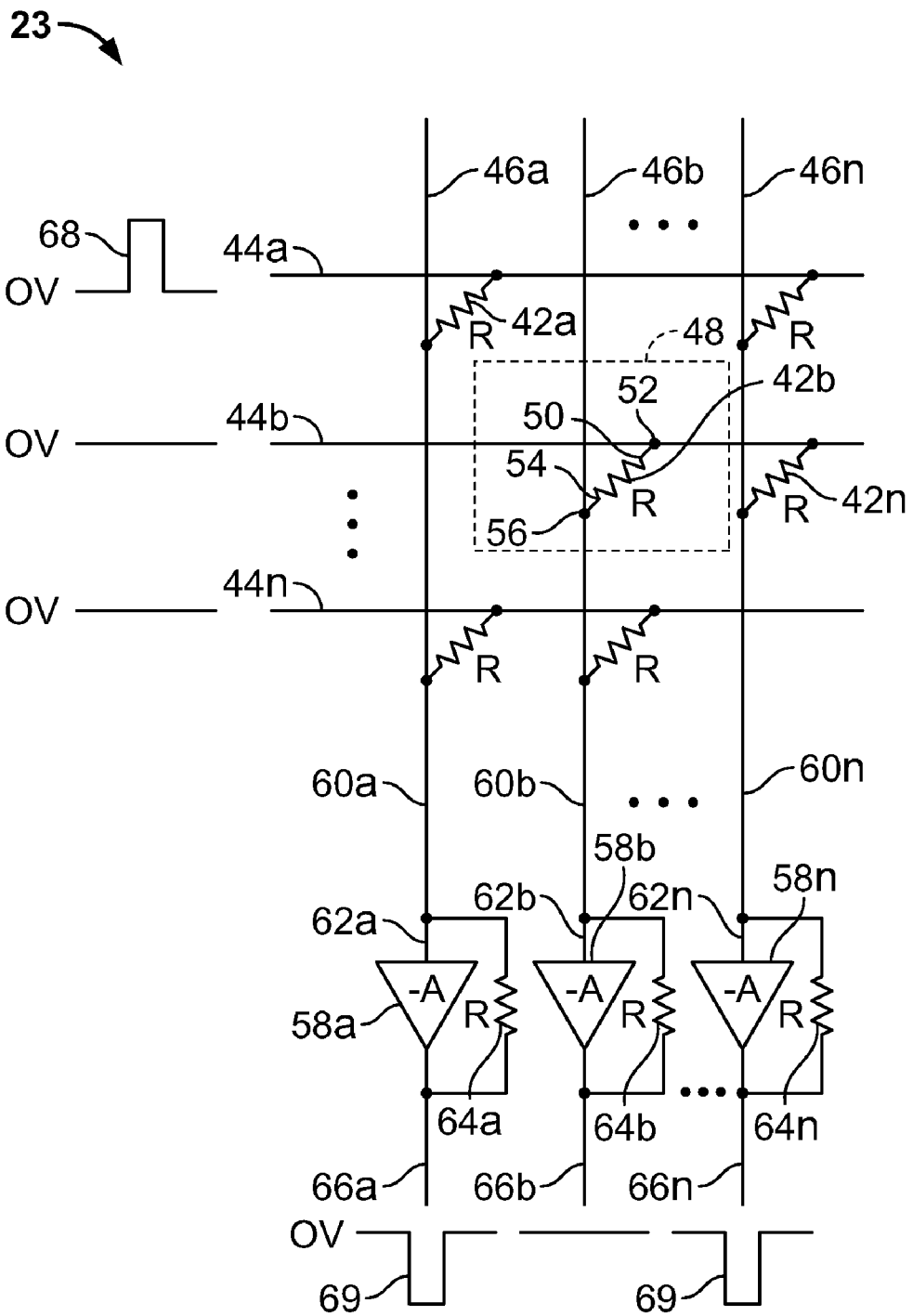
FIG. 3 is an electrical schematic diagram of a ROM, constructed from an array of resistive elements in accordance with the embodiment of FIG. 2.

FIG. 3 is an electrical schematic diagram of a resistor-based embodiment of the ROM. The ROM 23 includes a plurality of row conductors 44a-44n. Likewise, the ROM 23 includes a plurality of column conductors 46a-46n. A ROM cell 48 includes a segment of one of the row conductors 44b, a segment of one of the column conductors 46b, and one of the resistors 42b. One end 50 of a resistor 42b is connected to a contact 52 on the row conductor 44b and the other end 54 of the resistor 42b is connected to a contact 56 on the column conductor 46b. A logical state, set to zero or one, is permanently encoded into the ROM cell 48 during fabrication by the presence or absence of the resistor 42b between the row conductor 44b and the column conductor 46b. External active components, such as operational amplifiers 58a-58n, are located at the outputs 60a-60n of each of the column conductors 46a-46n, and act as driver electronics for the ROM 23, producing each of the logical states. A set of feedback resistors 64a-64n is connected in a negative feedback configuration from the inputs 62a-62n to corresponding outputs 66a-66n of the operational amplifiers 58a-58n.

Figure 1:
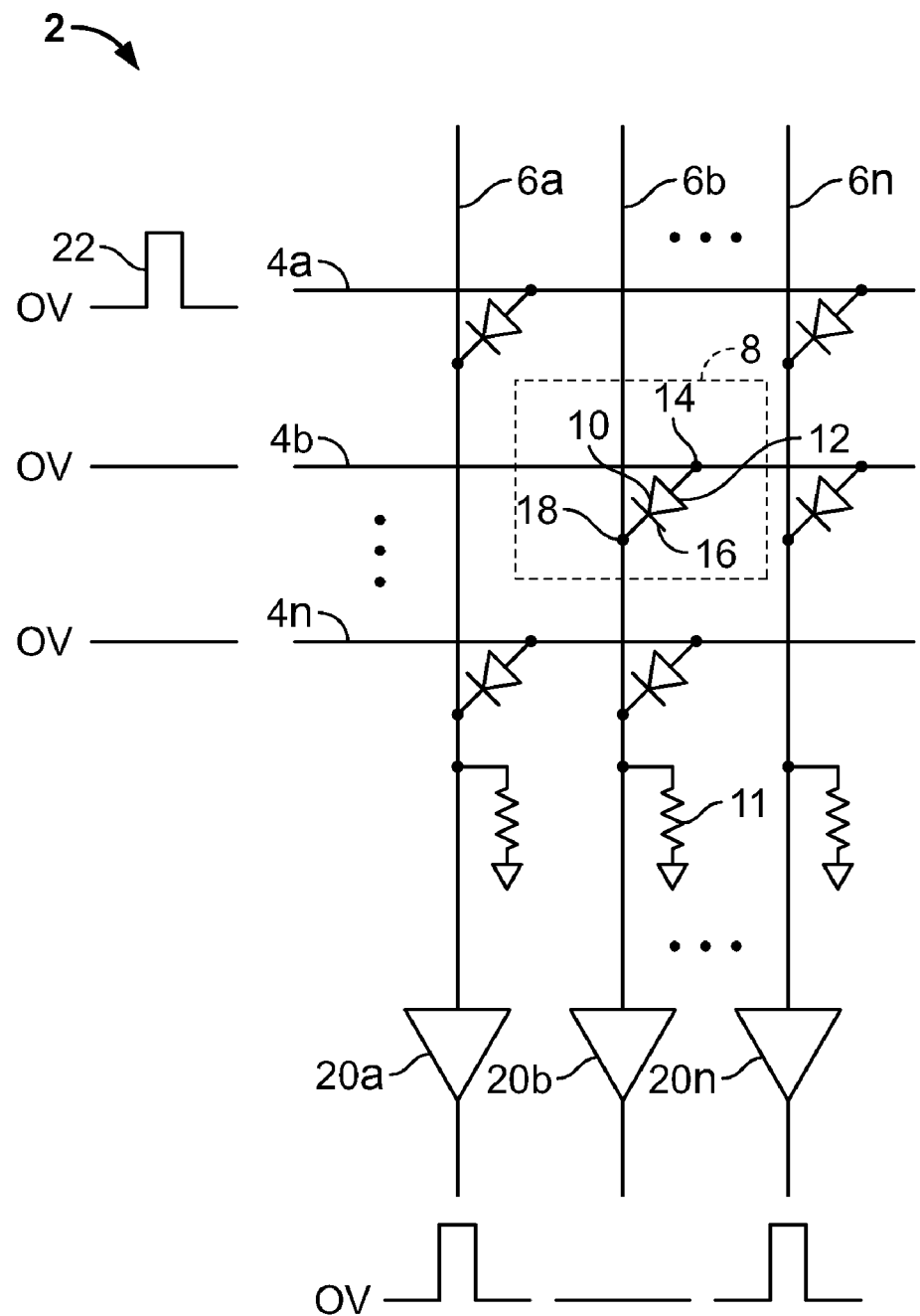
FIG. 1 is an electrical schematic diagram of a prior art ROM constructed from an array of diodes.

In operation, the amplifiers 58a-58n thus connected function as current sensing or transimpedance amplifiers, wherein a current sensed at one or more of the inputs 62a-62n is converted to one or more voltages at the outputs 66a-66n. For very large values of the open-loop voltage gain A, the output voltage of an amplifier 58b has a value of $V=-I\,R_f$, where I is the input current and $R_f$ is the feedback resistance of the resistor 64b. The amplifier's input 62b can be made to appear as a virtual ground, i.e. as a very small resistance to ground, because its input resistance is $R_f/(A+1)$, and this quantity can be made very small by using an amplifier with large open-loop gain −A. It is necessary that the input 62b appear as a virtual ground in order to prevent crosstalk between the row conductors 44a-44n, a problem that does not occur in the prior-art ROM of FIG. 1 because of the nonlinear properties of the nonlinear elements (e.g. diodes), but at the expense of a much more difficult fabrication process. The information in a particular row conductor, e.g. 44a, is read out by an amplifiers 58a-58n by applying a positive voltage pulse 68 on the row conductor 44a, and sensing the voltage pulses 69 emanating from all the amplifiers 58a-58n on all of the column conductors 46a-46n. The virtual ground produced by the transimpedance amplifier configuration on each of the column conductors 46a-46n avoids the problem of unselected rows 44b-44n interfering with the readout of the selected row. The use of a virtual ground on the columns is a unique feature of this invention that allows the use of linear passive elements such as resistors, so that nonlinear elements such as diodes are not required. This allows for a simple, low-cost fabrication process that is fully compatible with large-area, flexible substrates.

A row conductor 44a is selected for reading when a positive voltage pulse 68 is applied to it. Since all columns have current amplifiers with virtual-ground inputs, current will flow through all resistors attached to the row conductor 44a. No current will flow from the row conductor 44a into those columns where no resistor is present at the row-column intersection. If we consider the presence of a resistor to encode in the ROM a "1", and the absence of a resistor a "0", then current will flow into columns where there is a "1" encoded, and no current into columns where a "0" is encoded. At the output of the amplifiers 58a-58n, voltages will appear representing the ROM data in row 44a. No current will flow from other rows into the columns, because all of the other rows are held at zero volts, as are all the columns because of the virtual-ground inputs of the current amplifiers 58a-58n. Thus, data is read only from the selected row conductor 44a. Any row can be read by applying a positive voltage pulse to that row. Reading can be a very fast operation because all row conductors 44a-44n and column conductors 46a-46n are held at fixed voltages as a read is performed.

Proper operation requires that very little current flows from a column into the non-selected rows 44b-44n, since this will produce crosstalk. More precisely, the minimum parallel resistance of the resistors attached between a column and non-selected rows 44b-44n must be much higher than the input resistance of the amplifier attached to that column. If the resistance present at a row-column intersection to encode a "1" has a value R, then the minimum resistance between that column and non-selected rows is R/(N−1), where N is the number of rows. When the number of rows is large, as it typically will be in a ROM, we can approximate this as R/N. The input resistance of a transimpedance amplifier 58b is $R_f/(A+1)$ where $R_f$ is the feedback resistance 64b, and −A is the open-loop voltage gain of the amplifier 58b. When A is large (A>>1), as is typically the case for operational amplifiers, we can approximate the input resistance as $R_f/A$. Therefore, proper ROM operation requires that $R/N>>R_f/A$. As an example, if the values for these parameters are set to $A=10^5$, $R_f=10^4$, $N=10^3$, $R=10^5$, then the inequality $R/N>>R_f/A$ is easily satisfied for an array with one thousand rows. There is no constraint on the number of columns. Thus, a one megabit (1000×1000) ROM array is achievable.

Figure 4:
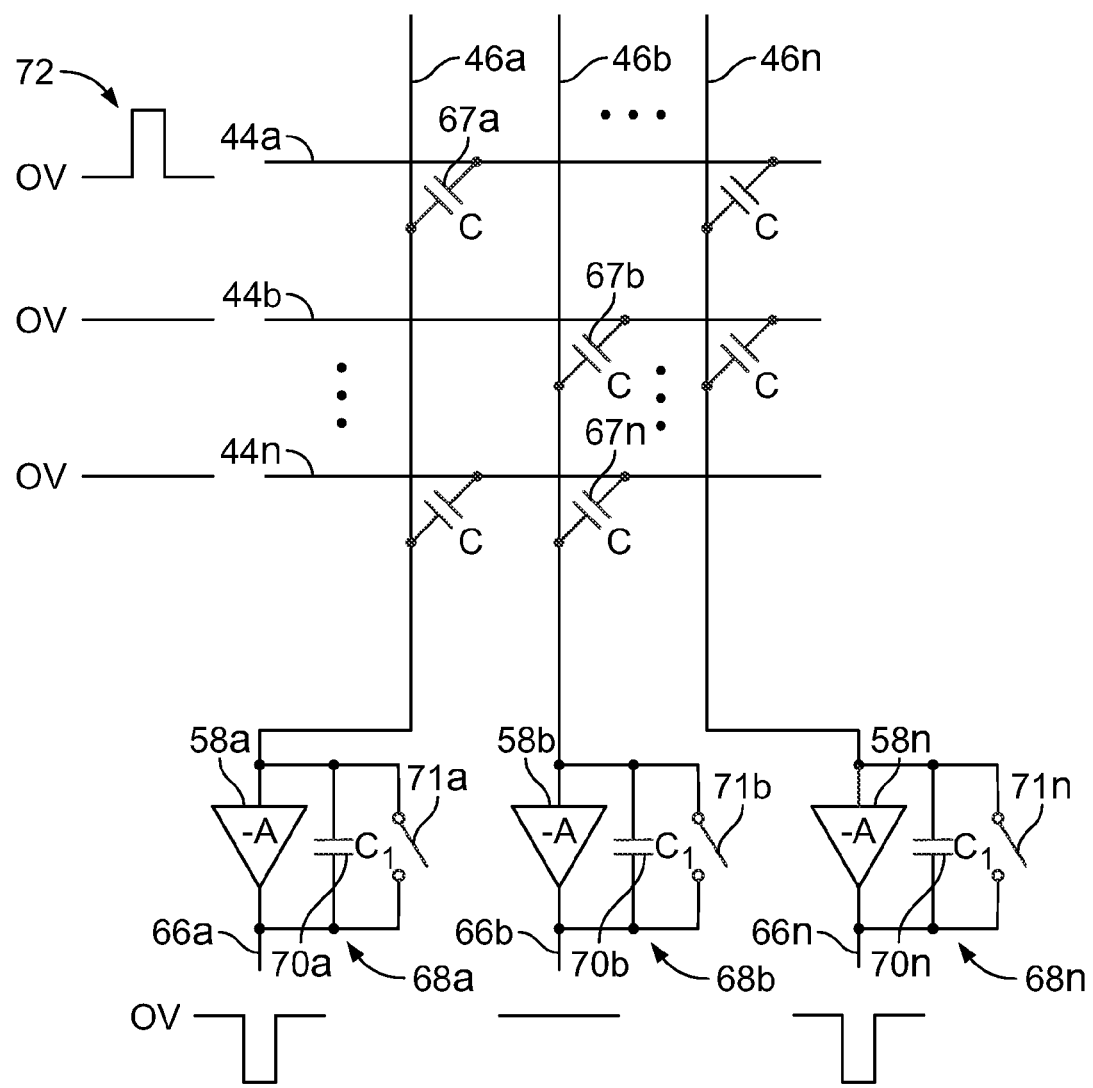
FIG. 4 is an electrical schematic diagram of a ROM, constructed from an array of capacitive elements in accordance another embodiment of the present invention.

FIG. 4 depicts an alternative embodiment of the ROM depicted in FIG. 3. Elements illustrated in FIG. 4 which correspond to the elements described above in connection with the embodiment of FIG. 3 have been identified by the same reference numbers. Unless otherwise indicated, both embodiments have the same construction and operation.

Referring to FIG. 4, lower power operation can be achieved by replacing the resistive elements by capacitive elements 67a-67n, and replacing the current-sensing amplifiers by charge-sensing amplifiers. The array operates at lower power because no DC current flows through the linear passive elements, but only capacitive charging and discharging currents. Each of the charge-sensing amplifiers 68a-68n includes a corresponding operational amplifier 58a-58n with open-loop gain −A, as before, but now the feedback resistors 64a-64n ($R_f$) in FIG. 3 are replaced by feedback capacitors 70a-70n ($C_f$) in FIG. 4. Reset switches 71a-71n are shunted across the feedback capacitors 70a-70n in the feedback loop of each of the charge-sensing amplifiers 68a-68n. The reset switches 71a-71n, when closed, discharge the feedback capacitors 70a-70n to allow a DC level within the linear range of the amplifiers 58a-58n, preferably zero volts, to be established at the input and output of amplifiers 58a-58n. For example, the reset operation could be performed after each row is read out, or after the entire array has been read out. The exact frequency of resetting the charge amplifiers 68a-68n is unimportant.

In operation, a selection pulse 72 applied to a row conductor 44a causes charge to flow into the charge amplifier 68a at the end of a column conductor 46a, if there is a capacitor at that row-column intersection. The charge is converted to a voltage at the output 66a of the charge amplifier 68a. Thus the voltage at the output 66a of the charge amplifiers 68a represents the ROM data, just as with the resistive approach of FIG. 3. In analogy to the resistive approach of FIG. 3, proper ROM operation requires that $C/N>>C_f/A$, where the capacitance present at a row-column intersection to encode a "1" has a value C.

The present invention is subject to other applications and modifications. For example, the embodiments of FIGS. 3 and 4 have described a ROM cell as encoding zeros and ones by the presence or absence of a linear passive element, such as a resistance or capacitance. In some applications, more than one bit of information can be encoded in each ROM cell by using multiple values of resistance or capacitance. The amplifiers are analog devices that register the different resistances or capacitances as different voltages at their outputs. For example, four possible values of resistance would allow two bits of information to be encoded in each ROM cell.

Another embodiment of the present invention employs an array of linear passive elements for imager arrays, such as radiation imagers and pressure imagers. For radiation imagers, a layer of material whose resistance varies with the incident radiation is metallized with row and column electrodes, possibly but not necessarily on the front and back of the layer. For example, the layer might be made of a semiconducting film, since many semiconducting materials have the property that their resistance varies with incident radiation. The variable flux of incident radiation creates a pattern of varying resistances across the array, which can be read out of the array in exactly the same way as with the resistor ROM array. The radiation can be visible light, infrared radiation, X-rays, etc. For pressure imagers a layer of piezoresistive material, i.e. a material whose resistance varies with applied pressure, is metallized with row and column electrodes, possibly but not necessarily on the front and back of the layer. For example, the layer might be made of a carbon-loaded polymer film. There are varying degrees of pressure, so that resistances will vary across the array. The current amplifiers are analog devices that register the varying resistances as varying voltages at their outputs, which can be read out of the array in exactly the same way as described previously. The varying output voltages can be measured by a microprocessor via an A/ID converter. One application of the pressure imager is a fingerprint imager. The variable pressure from the ridges and valleys of a fingerprint create a pattern of varying resistances, allowing the fingerprint pattern to be read out of the array.

Figure 5:
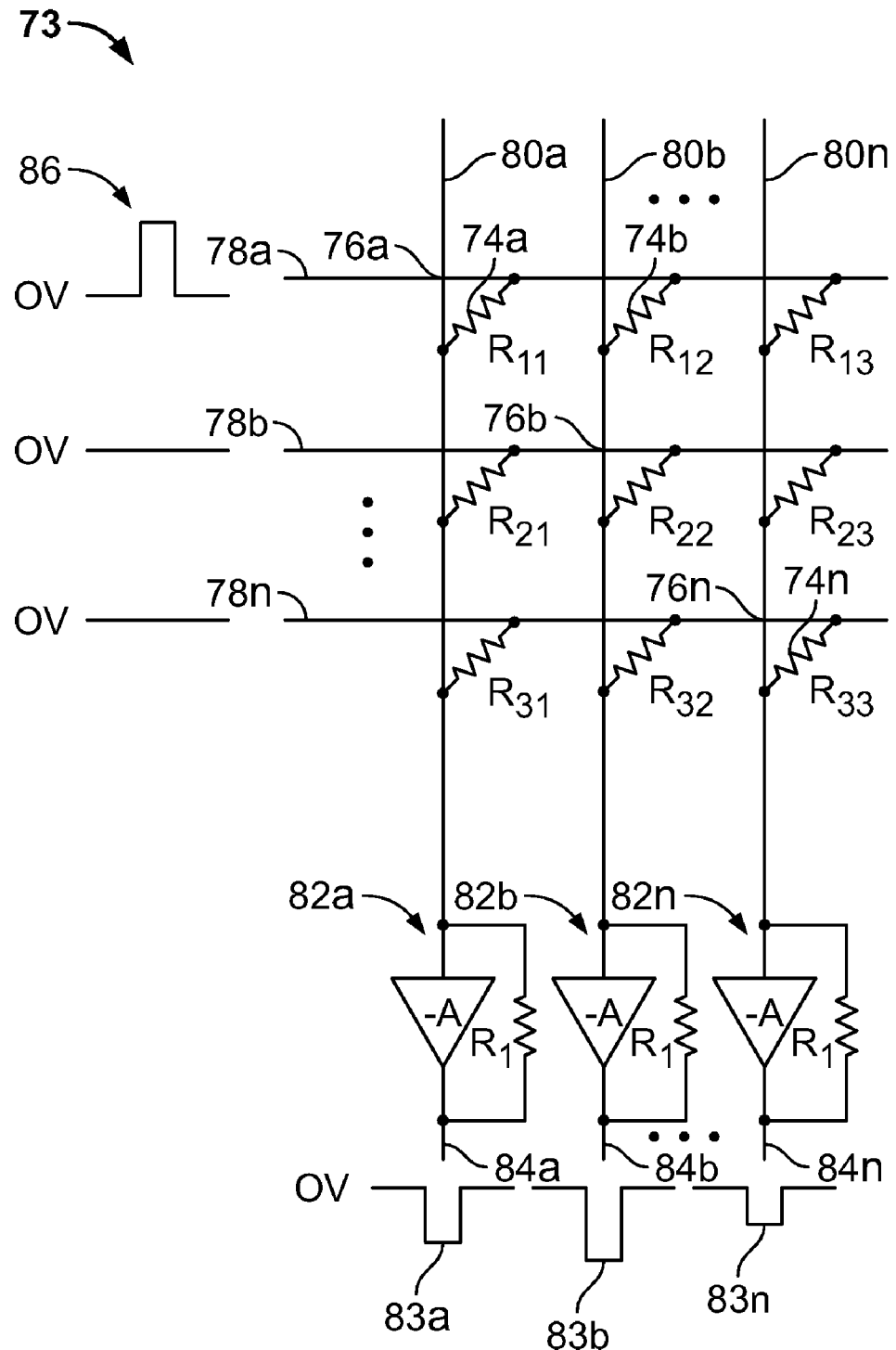
FIG. 5 is an electrical schematic diagram of a variable resistance-based imager array, constructed in accordance with another embodiment of the present invention.

FIG. 5 is an electrical schematic diagram of an imager, constructed in accordance with the variable resistance embodiment discussed above. An array 73 of variable resistors 74a-74n ($R_{ij}$ where i represents the row and j represents the column) are arranged at the intersections 76a-76n of row conductors 78a-78n and column conductors 80a-80n. The resistance of a resistor 74b ($R_{ij}$) depends on the intensity of radiation falling on that resistor, so that the resistances vary across the array 73, depending on the image. Since the current amplifiers 82a-82n are analog devices that register the varying resistances as varying voltages 83a-83n at their outputs 84a-84n generated from an selection pulse 86, then in a manner similar to the ROM array 23 in FIG. 3, the array 73 can be read out, row by row.

As with the ROM array 23 of FIG. 3, imagers based on linear passive elements also lend themselves to a capacitive approach in addition to a resistive approach. For example, for a pressure imager that is used as a fingerprint imager, instead of pressure-induced resistance changes being sensed, the variable capacitance of the ridges and valleys of a fingerprint pattern can also be sensed. The fingerprint ridges create enhanced capacitance between row and column conductors. The current amplifiers 82a-82n, described above for FIG. 5, are replaced by charge amplifiers, as with the capacitive array of FIG. 4.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. A read-only memory (ROM), comprising:
   a substrate;
   a plurality of row conductors insulated from each other and at least partially layered on a portion of said substrate;
   a plurality of column conductors insulated from each other and from said row conductors and at least partially layered on a portion of said plurality of row conductors;
   a plurality of amplifiers electrically connected to said column conductors; and
   at least one linear passive element attached between said row conductors and said column conductors,
   wherein at least one of said amplifiers connected to one of said column conductors has an input impedance much lower than the combined parallel impedance of said linear passive elements connected to said one of said column conductors, thus comprising a virtual ground, and at least one of said amplifiers connected to one of said column conductors is operable to output a first logical state when one of said linear passive elements is electrically connected between one of said row conductors and said one of said column conductors, and wherein said at least one of said amplifiers is operable to output a second logical state when said one of said linear passive elements is absent between said one of said row conductors and said one of said column conductors.

2. The ROM of claim 1, wherein said at least one linear passive element is a resistor.

3. The ROM of claim 2, wherein said resistor can have multiple values of resistance in order to encode more than one bit of data.

4. The ROM of claim 2, wherein each of said amplifiers further comprises a feedback resistor electrically connected between a first output of an amplifier and a first input of an amplifier.

5. The ROM of claim 1, wherein each of said linear passive elements includes a first end and a second end and is present at each row-column intersection, said first end of said linear passive elements being electrically connected to a row conductor by means of a conducting strap.

6. The ROM of claim 1, wherein each of said linear passive elements includes a first end and a second end and is present at each row-column intersection, said second end of said linear passive elements being electrically connected to a column conductor by means of a conducting strap.

7. The ROM of claim 1, wherein said at least one of said linear passive elements is created using one of resistive inks and conductive inks.

8. The ROM of claim 7, wherein said one of resistive inks and conductive inks are printed by means of one of screen printing and ink-jet printing.

9. The ROM of claim 1, wherein said substrate is flexible.

10. The ROM of claim 9, wherein said flexible substrate is made of one of polyethylene terephthalate (PET) and polyamide.

11. The ROM of claim 1, wherein said at least one linear passive element is a capacitor.

12. The ROM of claim 11, wherein said capacitor can have multiple values of capacitance in order to encode more than one bit of data.

13. The ROM of claim 11, wherein each of said amplifiers further comprises a feedback capacitor, said capacitor being electrically connected between a first output of an amplifier and a first input of an amplifier.

14. An imager, comprising:
a substrate;
a plurality of row conductors insulated from each other and at least partially layered on a portion of said substrate;
a plurality of column conductors insulated from each other and from said row conductors and at least partially layered on a portion of said plurality of row conductors;
a plurality of amplifiers electrically connected to said column conductors; and
a plurality of linear passive elements of variable value, a corresponding one of said linear passive elements being electrically connected between one of said row conductors and one of said column conductors, said variable value being sensitive to the pattern of an image incident on the imager,
wherein at least one of said amplifiers connected to one of said column conductors has an input impedance much lower than the combined parallel impedance of said linear passive elements connected to said one of said column conductors, thus comprising a virtual ground, wherein a selected one of said amplifiers connected to one of said column conductors is operable to output a variable voltage in direct proportion to the value of one of said linear passive elements when a voltage is applied to a selected one of said row conductors.

15. The imager of claim 14, wherein said linear passive elements are resistors.

16. The imager of claim 15, wherein said resistance of each of said resistors changes in response to a change in incident radiation.

17. The imager of claim 16, wherein each of said resistors is a made from a semiconductor.

18. The imager of claim 15, wherein said resistance of each of said resistors changes in response to a change of applied pressure.

19. The imager of claim 14, wherein said linear passive elements are capacitors.

20. The imager of claim 19, wherein said capacitance of each of said capacitors changes in response to a change in incident radiation.

21. The imager of claim 20, wherein each of said capacitors is made from a semiconductor.

22. The imager of claim 19, wherein said capacitance of each of said capacitors changes in response to a change of applied pressure.

23. The imager of claim 19, wherein each of said amplifiers further comprises a feedback capacitor, said capacitor being electrically connected between a first output of an amplifier and a first input of an amplifier.

24. The imager of claim 14, wherein said substrate is flexible.

25. The imager of claim 24, wherein said flexible substrate is made of one of PET and polyamide.

26. A method for reading a bit value from a read-only memory, comprising the steps of:
providing a ROM comprising:
a substrate;
a plurality of row conductors insulated from each other and at least partially layered on a portion of said substrate;
a plurality of column conductors insulated from each other and from said row conductors and at least partially layered on a portion of said plurality of row conductors;
a plurality of amplifiers electrically connected to said column conductors wherein at least one of said amplifiers connected to one of said column conductors has an input impedance much lower than the combined parallel impedance of said linear passive elements connected to said one of said column conductors, thus comprising a virtual ground; and
at least one linear passive element attached between said row conductors and said column conductors,
applying a voltage to a selected one of the row conductors;
sensing a first logic state from a selected one of said amplifiers connected to one of said column conductors when one of said linear passive elements is electrically connected between one of said row conductors and said one of said column conductors; and
sensing a second logic state from said selected one of said amplifiers connected to one of said column conductors when said one of said linear passive elements is absent between said one of said row conductors and said one of said column conductors.

27. A read-only memory (ROM), comprising:
a substrate;

a plurality of row conductors insulated from each other and at least partially layered on a portion of said substrate;

a plurality of column conductors insulated from each other and from said row conductors and at least partially layered on a portion of said plurality of row conductors;

a plurality of amplifiers electrically connected to said column conductors; and at least one linear passive element attached between said row conductors and said column conductors, wherein at least one of said amplifiers connected to one of said column conductors is operable to output a first logical state when one of said linear passive elements is electrically connected between one of said row conductors and said one of said column conductors, and wherein said at least one of said amplifiers is operable to output a second logical state when said one of said linear passive elements is absent between said one of said row conductors and said one of said column conductors.

28. The ROM of claim 27, wherein said at least one linear passive element is a resistor.

29. The ROM of claim 27, wherein said at least one linear passive element is a capacitor.

30. The ROM of claim 27, wherein said substrate is flexible.

* * * * *